United States Patent
Prabhu et al.

(10) Patent No.: US 7,063,597 B2
(45) Date of Patent: Jun. 20, 2006

(54) POLISHING PROCESSES FOR SHALLOW TRENCH ISOLATION SUBSTRATES

(75) Inventors: Gopalakrishna B. Prabhu, San Jose, CA (US); Thomas H. Osterheld, Mountain View, CA (US); Garlen C. Leung, Cupertino, CA (US); Adam H. Zhong, Milpitas, CA (US); Peter McReynolds, San Mateo, CA (US); Yi-Yung Tao, Hsin Chu (TW); Gregory E. Menk, Pleasanton, CA (US); Vasanth N. Mohan, San Jose, CA (US); Christopher Heung-Gyun Lee, Alameda, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/693,683

(22) Filed: Oct. 24, 2003

(65) Prior Publication Data
US 2004/0142640 A1    Jul. 22, 2004

Related U.S. Application Data (60) Provisional application No. 60/421,444, filed on Oct. 25, 2002.

(51) Int. Cl.
*B24B 1/00* (2006.01)
(52) U.S. Cl. .......................... 451/41; 451/57
(58) Field of Classification Search ................ 451/57, 451/41, 66, 285–289; 45/287, 288
See application file for complete search history.

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 5,152,917 A | 10/1992 | Pieper et al. | 51/295 |
| 5,244,534 A | 9/1993 | Yu et al. | 156/636 |
| 5,340,370 A | 8/1994 | Cadien et al. | 51/308 |
| 5,342,419 A | 8/1994 | Hibbard | 51/308 |
| 5,368,619 A | 11/1994 | Culler | 51/308 |
| 5,378,251 A | 1/1995 | Culler et al. | 51/295 |
| 5,395,801 A | 3/1995 | Doan et al. | 437/225 |
| 5,453,312 A | 9/1995 | Haas et al. | 428/143 |
| 5,514,245 A | 5/1996 | Doan et al. | 156/636.1 |

(Continued)

FOREIGN PATENT DOCUMENTS

EP    1 068 928    1/2000

(Continued)

OTHER PUBLICATIONS

Gagliardi, et al. "3M SlurryFree™ CMP Fixed Abrasives for Direct HDP STI COMP", Technical Brief, Oct. 2000.

(Continued)

*Primary Examiner*—Jacob K. Ackun, Jr.
(74) *Attorney, Agent, or Firm*—Patterson and Sheridan (57) ABSTRACT

Methods and compositions are provided for planarizing a substrate surface with reduced or minimal topographical defect formation during a polishing process for dielectric materials. In one aspect a method is provided for polishing a substrate containing two or more dielectric layers, such as silicon oxide, silicon nitride, silicon oxynitride, with at least one processing step using a fixed-abrasive polishing article as a polishing article. The processing steps may be used to remove all, substantially all, or a portion of the one or more dielectric layers, which may include removal of the topography, the bulk dielectric, or residual dielectric material of a dielectric layer in two or more steps.

14 Claims, 3 Drawing Sheets

U.S. PATENT DOCUMENTS

| | | | |
|---|---|---|---|
| 5,516,346 A | 5/1996 | Cadien et al. | 51/308 |
| 5,614,444 A | 3/1997 | Farkas et al. | 437/225 |
| 5,676,587 A * | 10/1997 | Landers et al. | 451/57 |
| 5,692,950 A | 12/1997 | Rutherford et al. | 451/552 |
| 5,700,383 A | 12/1997 | Feller et al. | 216/88 |
| 5,738,574 A | 4/1998 | Tolles et al. | 451/288 |
| 5,738,800 A | 4/1998 | Hosali et al. | 216/99 |
| 5,759,917 A | 6/1998 | Grover et al. | 438/690 |
| 5,769,689 A | 6/1998 | Cossaboon et al. | 451/41 |
| 5,770,095 A | 6/1998 | Sasaki et al. | 216/38 |
| 5,817,567 A | 10/1998 | Jang et al. | 438/427 |
| 5,867,757 A | 2/1999 | Okazaki et al. | 399/262 |
| 5,876,508 A | 3/1999 | Wu et al. | 134/2 |
| 5,897,426 A | 4/1999 | Somekh | 451/41 |
| 5,913,712 A | 6/1999 | Molinar | 451/41 |
| 5,916,011 A | 6/1999 | Kim et al. | 451/41 |
| 5,916,016 A | 6/1999 | Bothra | 451/398 |
| 5,922,136 A | 7/1999 | Huang | 134/2 |
| 5,922,620 A | 7/1999 | Shimomura et al. | 438/693 |
| 5,932,486 A | 8/1999 | Cook et al. | 438/692 |
| 5,934,980 A | 8/1999 | Koos et al. | 451/41 |
| 5,951,380 A | 9/1999 | Kim | 451/65 |
| 5,951,724 A | 9/1999 | Hanawa et al. | 51/309 |
| 5,958,794 A | 9/1999 | Bruxvoort et al. | 438/692 |
| 5,968,239 A | 10/1999 | Miyashita et al. | 106/3 |
| 5,981,394 A | 11/1999 | Ohashi et al. | 438/693 |
| 5,981,396 A | 11/1999 | Robinson et al. | 438/692 |
| 5,996,594 A | 12/1999 | Roy et al. | 134/1.3 |
| 5,996,595 A | 12/1999 | Olesen et al. | 134/1.3 |
| 6,001,730 A | 12/1999 | Farkas et al. | 438/627 |
| 6,019,806 A | 2/2000 | Sees et al. | 51/308 |
| 6,042,741 A | 3/2000 | Hosali et al. | 252/79.1 |
| 6,043,155 A | 3/2000 | Homma et al. | 438/693 |
| 6,046,112 A | 4/2000 | Wang | 438/693 |
| 6,054,379 A | 4/2000 | Yau et al. | 438/623 |
| 6,060,395 A | 5/2000 | Skrovan et al. | 438/692 |
| 6,062,954 A | 5/2000 | Izumi | 451/72 |
| 6,063,306 A | 5/2000 | Kaufman et al. | 252/79.4 |
| 6,068,879 A | 5/2000 | Pasch | 427/97 |
| 6,083,840 A | 7/2000 | Mravic et al. | 438/692 |
| 6,091,131 A | 7/2000 | Cook et al. | 257/629 |
| 6,099,604 A | 8/2000 | Sandhu et al. | 51/307 |
| 6,114,249 A | 9/2000 | Canaperi et al. | 438/692 |
| 6,132,292 A | 10/2000 | Kubo | 451/36 |
| 6,136,218 A | 10/2000 | Skrovan et al. | 252/79.1 |
| 6,143,663 A | 11/2000 | Koutny, Jr. | 438/691 |
| 6,149,830 A | 11/2000 | Lin et al. | 216/89 |
| 6,159,075 A | 12/2000 | Zhang et al. | 438/693 |
| 6,162,112 A | 12/2000 | Miyazaki et al. | 451/36 |
| 6,162,368 A | 12/2000 | Li et al. | 216/89 |
| 6,168,508 B1 | 1/2001 | Nagahara et al. | 451/527 |
| 6,174,814 B1 | 1/2001 | Cook et al. | 438/692 |
| 6,193,790 B1 | 2/2001 | Tani | 106/3 |
| 6,206,756 B1 | 3/2001 | Chopra et al. | 451/28 |
| 6,221,118 B1 | 4/2001 | Yoshida et al. | 51/309 |
| 6,234,875 B1 | 5/2001 | Pendergrass, Jr. | 451/41 |
| 6,247,998 B1 | 6/2001 | Wiswesser et al. | 451/6 |
| 6,258,721 B1 | 7/2001 | Li et al. | 438/693 |
| 6,261,157 B1 * | 7/2001 | Bajaj et al. | 451/57 |
| 6,261,158 B1 | 7/2001 | Holland et al. | 451/63 |
| 6,273,786 B1 | 8/2001 | Chopra et al. | 451/28 |
| 6,276,996 B1 | 8/2001 | Chopra | 451/41 |
| 6,290,580 B1 | 9/2001 | Tanaka et al. | 451/44 |
| 6,294,105 B1 | 9/2001 | Feeney et al. | 252/79.1 |
| 6,316,366 B1 | 11/2001 | Kaufman et al. | 438/693 |
| 6,435,942 B1 | 8/2002 | Jin et al. | 451/8 |
| 6,435,945 B1 | 8/2002 | Somekh | 451/41 |
| 6,443,807 B1 * | 9/2002 | Sakai et al. | 451/5 |
| 6,468,910 B1 | 10/2002 | Srinivasan et al. | 438/692 |
| 6,595,831 B1 * | 7/2003 | Hirokawa et al. | 451/36 |
| 6,620,027 B1 | 9/2003 | Zutshi et al. | 451/5 |
| 6,676,484 B1 * | 1/2004 | Chopra | 451/7 |
| 6,709,316 B1 * | 3/2004 | Sun et al. | 451/41 |
| 6,783,432 B1 * | 8/2004 | Li et al. | 451/36 |
| 6,811,470 B1 * | 11/2004 | Bonner et al. | 451/41 |
| 2001/0004538 A1 | 6/2001 | Li et al. | 438/200 |
| 2001/0036738 A1 | 11/2001 | Hatanaka et al. | 438/693 |
| 2002/0146965 A1 * | 10/2002 | Thomas et al. | 451/41 |
| 2002/0173221 A1 * | 11/2002 | Li et al. | 451/5 |
| 2002/0197946 A1 | 12/2002 | Emami et al. | 451/527 |

FOREIGN PATENT DOCUMENTS

| | | |
|---|---|---|
| EP | 1 061 111 | 12/2000 |
| JP | 2000156360 | 6/1999 |
| JP | 2000068371 | 3/2000 |
| WO | 98/49723 | 11/1998 |
| WO | 99/46081 | 9/1999 |
| WO | 00/02235 | 1/2000 |
| WO | 00/30159 | 5/2000 |
| WO | 00/36037 | 6/2000 |
| WO | 00/49687 | 8/2000 |
| WO | 00/56391 | 9/2000 |
| WO | 03/009349 | 1/2003 |

OTHER PUBLICATIONS

US 6,204,181, 03/2001, Molnar (withdrawn)

* cited by examiner

POLISHING PROCESSES FOR SHALLOW TRENCH ISOLATION SUBSTRATES

CROSS-REFERENCE TO RELATED APPLICATIONS

This application claims benefit of U.S. provisional patent application Ser. No. 60/421,444, filed Oct. 25, 2002, which is herein incorporated by reference.

BACKGROUND OF THE INVENTION

1. Field of the Invention

The invention relates generally to the fabrication of semiconductor devices and to polishing and planarizing of substrates.

2. Description of the Related Art

Reliably producing sub-half micron and smaller features is one of the key technologies for the next generation of very large-scale integration (VLSI) and ultra large-scale integration (ULSI) of semiconductor devices. However, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

Multilevel interconnects are formed by the sequential deposition and removal of materials from the substrate surface to form features therein. As layers of materials are sequentially deposited and removed, the uppermost surface of the substrate may become non-planar across its surface and require planarization prior to further processing. Planarizing a surface, or "polishing" a surface, is a process where material is removed from the surface of the substrate to form a generally even, planar surface. Planarization is useful in removing excess deposited material and in removing undesired surface topography and surface defects, such as rough surfaces, agglomerated materials, crystal lattice damage, scratches, and contaminated layers or materials to provide an even surface for subsequent processing.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The substrate and polishing media are moved in a relative motion to one another.

A polishing composition is provided to the polishing media to effect chemical activity in removing material from the substrate surface. The polishing composition may contain abrasive material to enhance the mechanical activity between the substrate and polishing media. Thus, the CMP apparatus effects polishing or rubbing movement between the surface of the substrate and the polishing media while dispersing a polishing composition to effect both chemical activity and mechanical activity. The chemical and mechanical activity removes excess deposited materials as well as planarizing a substrate surface.

Chemical mechanical polishing may be used in the fabrication of shallow trench isolation (STI) structures. STI structures may be used to separate transistors and components of a transistor, such as source/drain junctions or channel stops, on a substrate surface during fabrication. STI structures can be formed by depositing a series of dielectric materials and polishing the substrate surface to remove excess or undesired dielectric materials. An example of a STI structure includes depositing a silicon nitride layer on an oxide layer formed on a silicon substrate surface, patterning and etching the substrate surface to form a feature definition, depositing a silicon oxide fill of the feature definitions, and polishing the substrate surface to remove excess silicon oxide to form a feature. The silicon nitride layer may perform as a barrier layer, a hard mask during etching of the features in the substrate and/or as a polishing stop during subsequent polishing processes. Such STI fabrication processes require polishing the silicon oxide layer to the silicon nitride layer with a minimal amount of silicon nitride removed during the polishing process in order to prevent damaging of the underlying materials, such as oxide and silicon.

The STI substrate is typically polished using conventional, abrasive-free, polishing media and an abrasive containing polishing slurry. However, polishing STI substrates with conventional polishing articles and abrasive containing polishing slurries has been observed to result in overpolishing of the substrate surface and forming recesses in the STI features and other topographical defects such as microscratches on the substrate surface. This phenomenon of overpolishing and forming recesses in the STI features is referred to as dishing. Dishing is highly undesirable because dishing of substrate features may detrimentally affect device fabrication by causing failure of isolation of transistors and transistor components from one another resulting in short-circuits. Additionally, overpolishing of the substrate may also result in nitride loss and exposing the underlying silicon substrate to damage from polishing or chemical activity, which detrimentally affects device quality and performance.

Figure 1A:
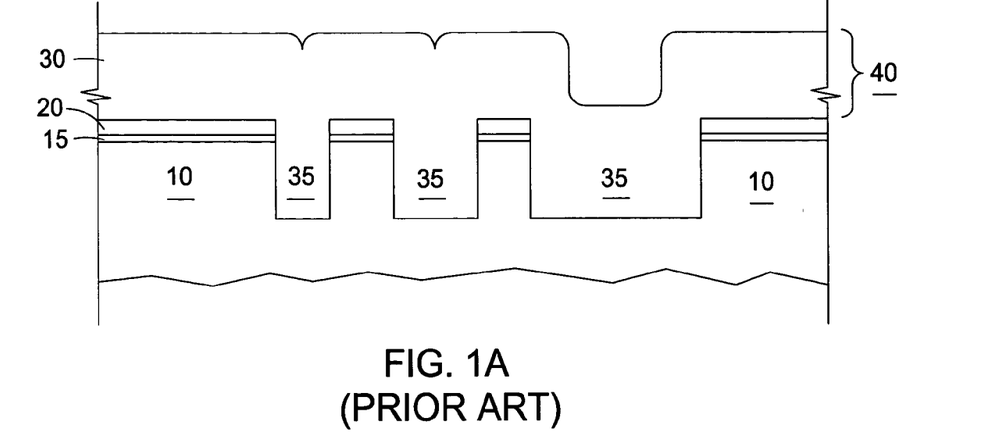
FIGS. 1A–1C are schematic diagrams illustrating the phenomena of dishing and nitride loss.
Figure 1B:
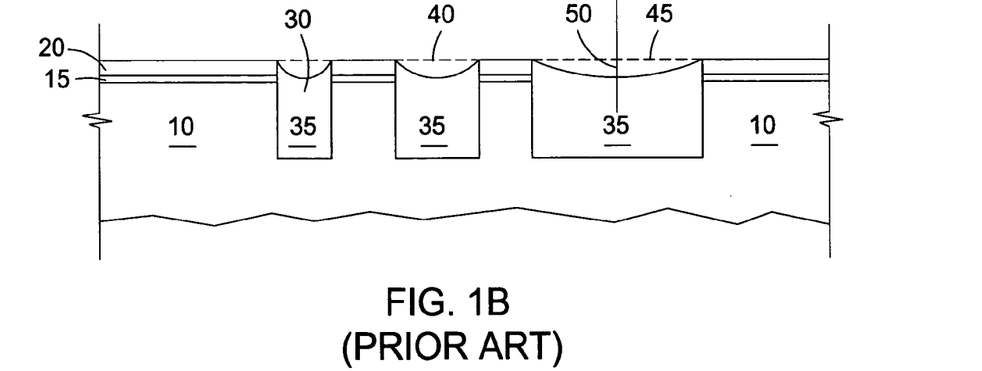
Figure 1C:
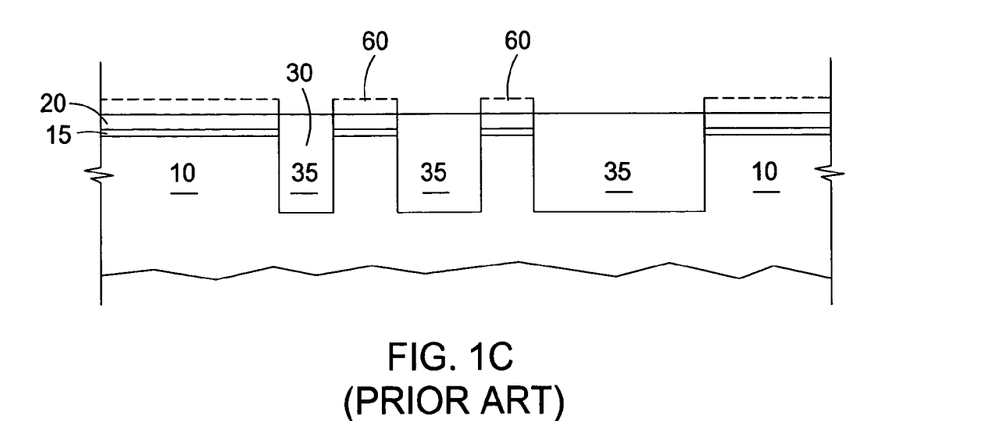

FIGS. 1A–1C are schematic diagrams illustrating the phenomena of dishing and nitride loss. FIG. 1A shows an example of a patterned STI substrate with a substrate 10, having a thermal oxide layer 15 disposed thereon, a polishing/etch stop layer 20, such as silicon nitride, disposed on the thermal oxide layer 15, and patterned to have feature definitions 35. The feature definitions 35 are then filled with a dielectric fill material 30, such as a silicon oxide material, with excess dielectric fill material 40 formed over the feature definitions 35 and silicon nitride layer 20.

FIG. 1B illustrates the phenomena of dishing observed with polishing by conventional techniques to remove the excess dielectric fill material 40. During polishing of the silicon oxide material 30 to the silicon nitride layer 20, the silicon oxide material 30 may be overpolished to remove any residual dielectric fill material 30, which may result in surface defects, such as recesses 45, formed in the dielectric fill material 30 in the feature definitions 35. The amount of dishing 50 from the desired amount of dielectric fill material 30 in the feature definitions 35 is represented by dashed lines.

FIG. 1C illustrates nitride loss from the surface of the silicon nitride layer 20 from excess polishing of the substrate surface with conventional polishing processes. Silicon nitride loss may take the form of excess removal of silicon nitride, or "thinning" of the silicon nitride layer, from the desired amount 60 of silicon nitride. Silicon nitride loss may also be premature removal of the silicon nitride layer and exposing the underlying oxide layer 15 and substrate material 10. The silicon nitride loss may render the silicon nitride layer 30 unable to prevent or limit damage to or contamination of the underlying substrate material during polishing or subsequent processing.

STI polishing with fixed-abrasive polishing articles have shown reduced dishing and improved polishing uniformity compared with conventional slurry polishing processes. A fixed-abrasive polishing article generally contains fixed-abrasive particles held in a containment media, or binder, which provides mechanical activity to the substrate surface, along with a plurality of geometric abrasive composite elements adhered to the containment media. However, conventional fixed-abrasive polishing processes have an inherently low removal rate of oxide material thereby increasing polishing times and reducing substrate throughput. Increased processing time may also occur in conventional deposition processes that use excess material deposition on the substrate surface, referred to as overfill, to ensure fill of features formed in the substrate surface.

Several approaches have been examined for limiting the extent of oxide overfill in forming STI features for improved processing throughput. One approach includes using multiple deposition, for example high density plasma chemical vapor deposition (HDP CVD) and etching steps to deposit, etch back, and re-fill substrate features. Another approach uses a sputter or etching process to thin the overfill deposited on the substrate surface. Other approaches include using a post deposition wet etch process to etch the oxide film so that there is still topography remaining for use with fixed-abrasive polishing articles. However, these processes have been observed to increase integration complexity and also have increased processing times and reduced substrate throughput.

Therefore, there exists a need for a method and polishing composition that facilitates the removal of dielectric materials with minimal or reduced defect formation during polishing of a substrate surface.

SUMMARY OF THE INVENTION

Aspects of the invention generally provide a method and composition for planarizing a substrate surface with reduced or minimal defects in surface topography. In one aspect, a method is provided for processing a substrate including providing a substrate comprising a first dielectric material disposed on a second dielectric material, polishing the substrate with a first polishing composition and a abrasive-free polishing article until bulk first dielectric material is substantially removed, and polishing the substrate with a second polishing composition and a fixed-abrasive polishing article to remove residual first dielectric material formed thereon.

In another aspect, a method is provided for processing a substrate including providing a substrate comprising a first dielectric material disposed on a second dielectric material, wherein the surface of the first dielectric material has a non-planar topography, polishing the substrate with a first polishing composition and a first fixed-abrasive polishing article to remove at least the topography of the first dielectric material, polishing the substrate with a second polishing composition and a abrasive-free polishing article until bulk first dielectric material is substantially removed; and polishing the substrate with a third polishing composition and a second fixed-abrasive polishing article to remove residual first dielectric material formed thereon.

In another aspect, a method for processing a substrate is provided including providing a substrate comprising a first dielectric material disposed on a second dielectric material, wherein the surface of the first dielectric material has a non-planar topography, polishing the substrate with a first polishing composition and a first fixed-abrasive polishing article to remove at least the topography of the first dielectric material, polishing the substrate with a second polishing composition and a second fixed-abrasive polishing article until bulk first dielectric material is substantially removed, and polishing the substrate with a third polishing composition and a third fixed-abrasive polishing article to remove residual first dielectric material formed thereon.

In another aspect, a method is provided for processing a substrate including providing a substrate comprising a first dielectric material disposed on a second dielectric material, wherein the surface of the first dielectric material has a non-planar topography, polishing the substrate with a first polishing composition and a first polishing article to remove at least the topography of the first dielectric material, polishing the substrate with a second polishing composition and a second polishing article until bulk first dielectric material is substantially removed, and polishing the substrate with an abrasive-containing polishing composition and a hard polishing article to remove residual first dielectric material formed thereon.

In another aspect, a method is provided for processing a substrate including providing a substrate comprising a first dielectric material disposed on a second dielectric material, wherein the surface of the first dielectric material has a non-planar topography, polishing the substrate with a first polishing composition and an abrasive-free polishing article to remove at least the topography of the first dielectric material, polishing the substrate with a second polishing composition and a first fixed-abrasive polishing article until bulk first dielectric material is substantially removed, and polishing the substrate with a third polishing composition and a second fixed-abrasive polishing article to remove residual first dielectric material formed thereon.

In another aspect, a method is provided for processing a substrate including providing a substrate comprising a first dielectric material disposed on a second dielectric material, wherein the surface of the first dielectric material has a non-planar topography, polishing the substrate with a first polishing composition and a fixed-abrasive polishing article to remove at least the topography of the first dielectric material, and polishing the substrate with a second polishing composition and a abrasive-free polishing article until bulk first dielectric material is substantially removed.

In another aspect, a method is provided for processing a substrate including providing a substrate comprising a first dielectric material disposed on a second dielectric material, wherein the surface of the first dielectric material has a non-planar topography, polishing the substrate with a first polishing composition and a first polishing article to remove at least the topography of the first dielectric material, polishing the substrate with a second polishing composition and a second polishing article until bulk first dielectric material is substantially removed, and polishing the substrate with an abrasive-containing polishing composition and a abrasive-free polishing article to remove residual first dielectric material formed thereon.

In another aspect, the surface of fixed-abrasive polishing articles may be altered or modified with a non-mechanical technique selected from the group of applying heat to the polishing article, chemical etching the polishing article, or combinations thereof, to increase abrasive discharge from the fixed-abrasive polishing article prior to or during a polishing step or process.

BRIEF DESCRIPTION OF THE DRAWINGS

So that the manner in which the above recited features are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide compositions and methods for planarizing a substrate surface with reduced or minimal defects in surface topography. The invention will be described below in reference to a planarizing process for the removal of dielectric material, such as silicon containing materials, from a substrate surface by chemical mechanical planarization, or chemical mechanical polishing (CMP) technique. Chemical mechanical polishing is broadly defined herein as polishing a substrate by a combination of chemical and mechanical activity.

The planarizing processes described herein may be performed by chemical mechanical polishing processing equipment, such as the Reflexion™ polishing system, the Mirra® polishing system, and the Mirra® Mesa™ polishing system, all of which are available from Applied Materials, Inc., of Santa Clara, Calif. The Reflexion™ polishing system is a linear polishing system more fully described in U.S. Pat. No. 6,244,935, and entitled, "Apparatus And Methods For Chemical Mechanical Polishing With An Advanceable Polishing Sheet," the entirety of which is incorporated herein by reference to the extent not inconsistent with the invention. The Mirra® polishing system is further described in U.S. Pat. No. 5,738,574, and entitled, "Continuous Processing System for Chemical Mechanical Polishing," the entirety of which is incorporated herein by reference to the extent not inconsistent with the invention.

Although the processes and compositions described herein may be referenced for use in the three platen Reflexion™ polishing system or Mirra® polishing system, any system enabling chemical mechanical polishing using the composition or processes described herein can be used to advantage. Examples of other suitable apparatus include orbital polishing systems and other linear polishing systems using a sliding or circulating polishing belt or similar device.

Chemical Mechanical Polishing Process

Aspects of the invention provide polishing methods and compositions to planarize a substrate surface with reduced or minimal topographical defect formation during a polishing process for dielectric materials. Generally, methods are provided for polishing a substrate containing two or more dielectric layers, such as silicon oxide, silicon nitride, silicon oxynitride, with at least one processing step using a fixed-abrasive polishing article as a polishing article. The processing steps may be used to remove all, substantially all or a portion of the one or more dielectric layers. For example, a processing step using a fixed-abrasive polishing article may be used to remove the topography, the bulk dielectric, and/or residual dielectric material of a dielectric layer.

Topography is broadly defined herein as any projections or recessions formed at the exposed surface of a dielectric material, which provides a non-planar surface. For example, high density plasma (HDP) chemical vapor deposition of silicon oxide may produce an exposed surface containing peaks of material extending above the bulk silicon oxide material. Bulk dielectric material is broadly described herein as dielectric material deposited on the substrate in an amount more than sufficient to substantially fill features formed on the substrate surface. The bulk dielectric material may also be referred to as overfill material or blanket material. Residual dielectric material is broadly defined as any bulk dielectric material remaining after one or more polishing process steps as well as the residue of any additional materials from layers disposed below the bulk dielectric material. Residual conductive material may partially or completely cover the surface a substrate. For example, residual material may cover about 25% or less of the surface area of the substrate. In another example, residual material may comprise about 25% or less of the originally deposited dielectric material, such as about 1000 Å remaining after a polishing step on 4000 Å of dielectric material.

Two-Step Polishing

A substrate may be polished in a two-step polishing process using a fixed-abrasive polishing article for at least one of the polishing steps.

Figure 2A:
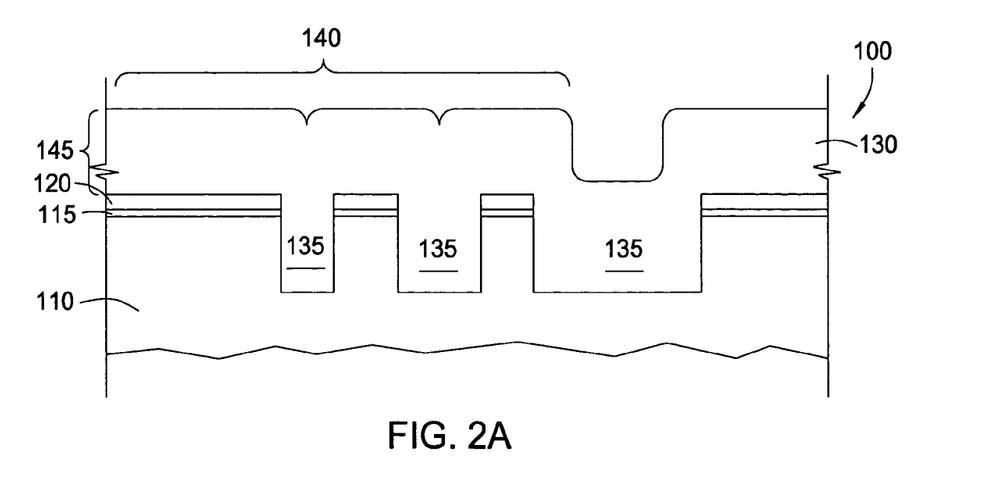
FIGS. 2A–2C are schematic diagrams illustrating one embodiment of a two-step polishing process.
Figure 2B:
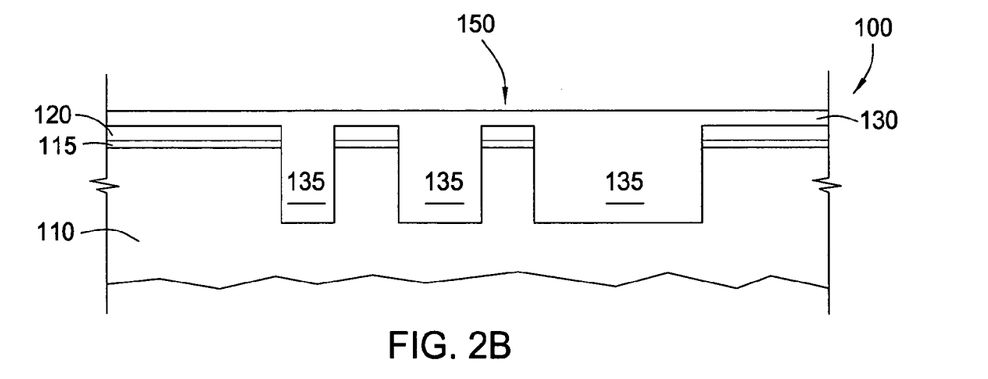
Figure 2C:
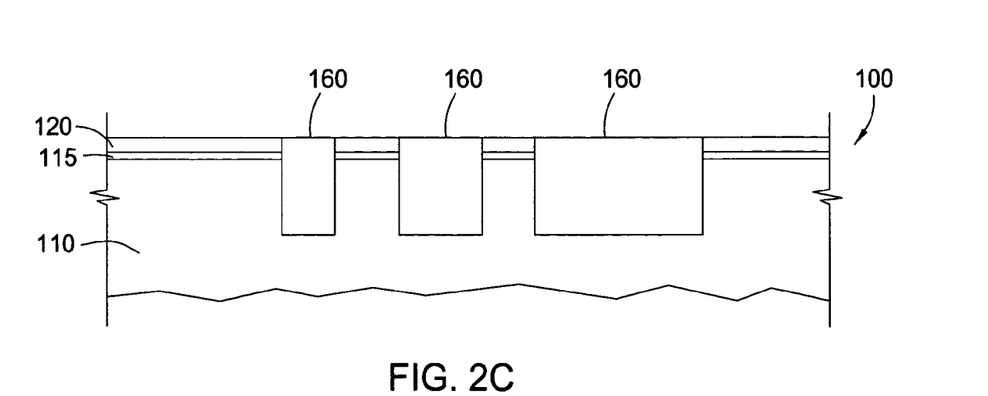

FIGS. 2A–2C illustrate one embodiment of a two-step polishing process. A substrate 100 having a patterned feature definitions 135 formed in a material layer 110, such as a polysilicon material or doped polysilicon layer, an oxide layer 115, such as silicon oxide, and a polishing/etch stop layer 120, such as a dielectric barrier or etch stop material, is subjected to a bulk deposition of a dielectric fill material 130 on the substrate surface in a sufficient amount to fill features definitions 135. The dielectric fill material is a first dielectric material, such as silicon oxide, and the dielectric barrier or etch stop material is a second dielectric material, such as silicon nitride.

The deposited dielectric fill material 130 generally has an excess material deposition 145 of bulk dielectric material, that has an uneven surface topography 140 with peak and recesses typically formed over feature definitions 135 having varying widths as shown in FIG. 2A. Dielectric fill material 130 is then polished in a first polishing step to remove the bulk of the dielectric fill material 130 over the barrier layer 120 as shown in FIG. 2B. The remaining dielectric fill material, residual dielectric material 150, is then polished in a second polishing step to form a planarized surface with isolated features 160 as shown in FIG. 2C.

In one embodiment of a two-step polishing process, a substrate having a first dielectric material, such as silicon oxide, disposed on a second dielectric material, such as silicon nitride, may be first polished with a first polishing composition and a abrasive-free polishing article to remove or substantially remove the bulk of the first dielectric material, and then be polished with a second polishing composition and a fixed-abrasive polishing article to remove any residual first dielectric material disposed on the substrate surface.

The first polishing step involves polishing the substrate with an abrasive-containing polishing composition, for example, silica or ceria slurry, on an abrasive-free polishing article to remove most of the topography and the bulk first dielectric material. An example of an abrasive-free polishing article is the IC-1000 polishing article commercially available from Rodel Inc., of Phoenix Ariz.

For example, the substrate may be polished with a silica slurry or ceria slurry on a conventional polishing article with the polishing to remove about 80% of the dielectric fill material 130, and ending when there is approximately 20% of residual dielectric material 150 remaining. The first polishing composition may be a non-selective or low selectivity polishing composition. Selectivity is broadly defined herein as the preferential removal of one material in comparison to another material and is typically denoted as a removal rate ratio between a first material and second, or subsequent, materials.

The second polishing step may include polishing a substrate with an abrasive-free polishing composition and a fixed-abrasive polishing article. The fixed-abrasive polishing article may be a high removal rate fixed-abrasive web material, for example, the SWR-521 fixed-abrasive polishing article, commercially available from 3M of Minneapolis, Minn. The abrasive-free polishing composition may be a high selectivity polishing composition to terminate the polishing process without removal of the second dielectric material. One example of a polishing composition for use with fixed-abrasive polishing articles is a proline or I-proline containing polishing composition which is more fully described in co-pending U.S. patent application Ser. No. 10/074,345, filed on Feb. 12, 2002, and entitled "STI Polish Enhancement Using Fixed Abrasives With Amino Acid Additives," which is incorporated herein by reference to the extent not inconsistent with the disclosure and claimed aspects herein.

Alternatively, the two-step method may comprise a first polishing step to remove the topography on the substrate surface by polishing the substrate with a first composition and a fixed-abrasive polishing article, and then polishing the substrate with a second polishing composition and an abrasive-free polishing article to remove or substantially remove the first dielectric material.

The fixed-abrasive polishing article may include a hard resin fixed-abrasive web, for example, SWR-159 or SWR-521, commercially available from 3M of Minneapolis, Minn. The first polishing composition is generally an abrasive-free polishing composition and may also be a low selective or high selective polishing composition. The initial polishing composition may also include additives, such as surfactants, to enhance removal or reduction of peaks or protuberances extending above the surface of the first dielectric material in order to more effectively remove topography.

The second polishing step involves polishing the substrate with an abrasive-containing polishing composition, for example, a silica slurry, on a conventional, abrasive-free polishing article to remove the first dielectric material. The second polishing composition may be a non-selective or low selectivity polishing composition.

Three-Step Polishing

The two-step polishing processes described above may be modified to perform a three-step polishing process by providing an initial processing step to remove topography on the substrate surface prior to removing the bulk of the dielectric material.

FIGS. 3A–3D illustrate one embodiment of a three-step polishing process. A substrate 200 having a patterned feature definitions 235 formed in a material layer 210, such as a polysilicon material or doped polysilicon layer, an oxide layer 215, such as silicon oxide, and a polishing/etch stop layer 220, such as a dielectric barrier or etch stop material, is subjected to a bulk deposition of a dielectric fill material 230 on the substrate surface in a sufficient amount to fill features definitions 235. The dielectric fill material 230 is a first dielectric material, such as silicon oxide, and the dielectric barrier or etch stop material of the polishing/etch stop layer 220 is a second dielectric material, such as silicon nitride.

Figure 3A:
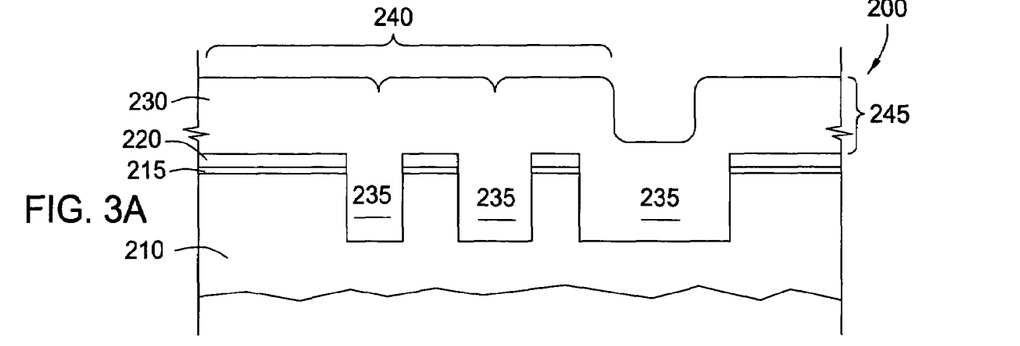
FIGS. 3A–3D are schematic diagrams illustrating one embodiment of a three-step polishing process.
Figure 3B:
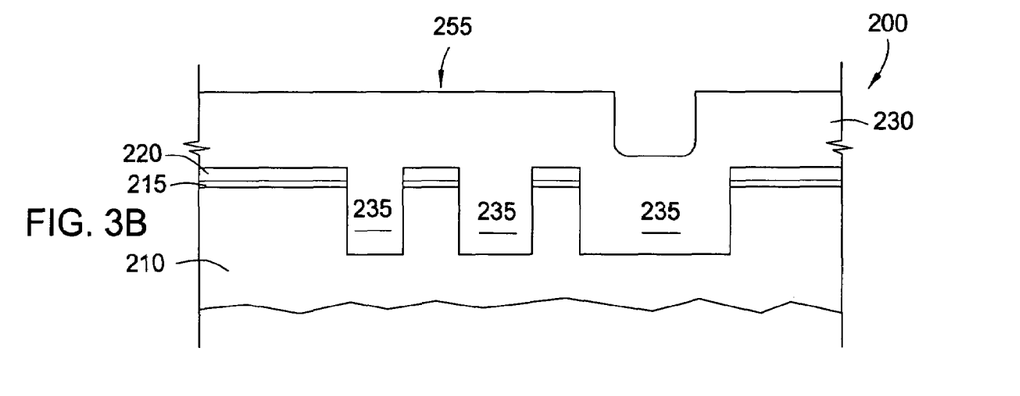

The deposited dielectric fill material 230 generally has an excess material deposition 245 of bulk dielectric material, that has an uneven surface topography 240 with peak and recesses typically formed over feature definitions 235 having varying widths as shown in FIG. 3A. The dielectric fill material 230 is then polished in a first polishing step to substantially remove the topography 240 formed on the surface of the dielectric fill material 230 to provide a substantially planarized surface 255 as shown in FIG. 3B.

Figure 3C:
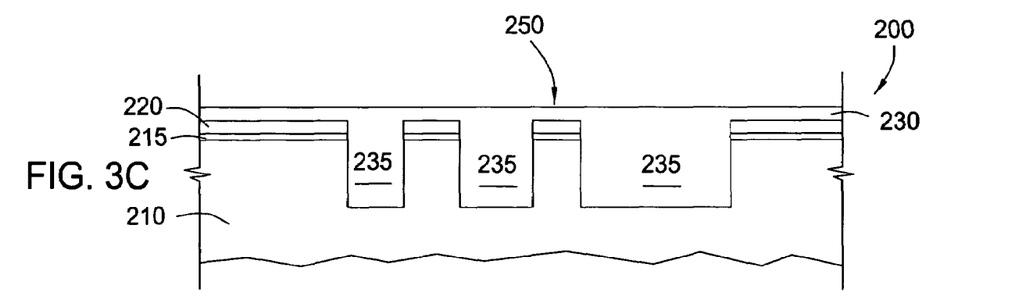
Figure 3D:
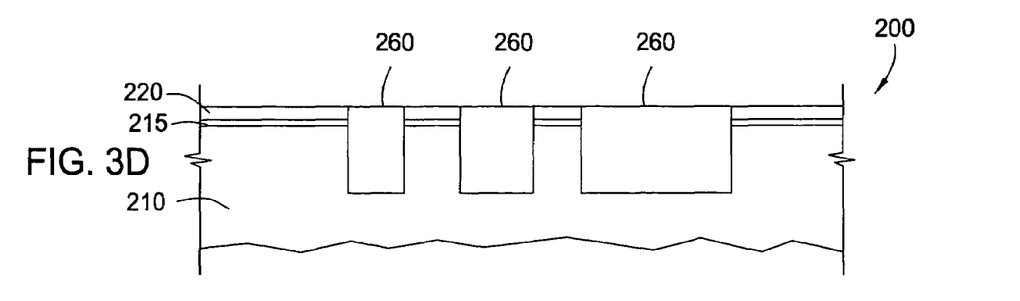

Some topography, such as material deposited over large features, may have valleys that extend substantially into the dielectric fill material 230 and may not be removed by the topography 240 polishing step. The dielectric fill material 230 is then polished in a second polishing step to remove the bulk of the dielectric material, over the barrier layer 220 as shown in FIG. 3C. The remaining dielectric fill material, residual dielectric material 250 is then polished in a third polishing step to form a planarized surface with isolated features 260 as shown in FIG. 3D.

In one embodiment, the initial polishing step may include polishing the substrate with an initial step polishing composition with a fixed-abrasive polishing article to remove all or substantially all of the topography 240. The fixed-abrasive polishing article may include a hard resin fixed-abrasive web, for example, SWR-159, commercially available from 3M of Minneapolis, Minn. The initial polishing composition is generally an abrasive-free polishing composition as described above and may also be a low selective or high selective polishing composition as described herein. The initial polishing composition may also include additives, such as surfactants, to enhance removal or reduction of peaks or protuberances extending above the surface of the first dielectric material in order to more effectively remove topography.

The remaining dielectric material 230 may be polished with the two-step polishing process described above as second and third polishing steps of the three-step polishing process. For example, referring to the two-step processes described above, the second polishing step involves polishing the substrate with a conventional abrasive-containing polishing composition, for example, a silica slurry or a ceria slurry, on an abrasive-free polishing article to remove most of the topography 240 and the bulk first dielectric material 230. For example, the substrate may be polished with a silica slurry or ceria slurry on a conventional polishing article with the polishing to remove about 80% of the dielectric fill material 130, and ending when there is approximately 20% of residual dielectric material 150 remaining. The first polishing composition may be a non-selective or low selectivity polishing composition.

The third polishing step may include polishing a substrate with an abrasive-free polishing composition and a fixed-abrasive polishing article. The fixed-abrasive polishing article may be a high removal rate fixed-abrasive web material, for example, the SWR-521 fixed-abrasive polishing article, commercially available from 3M of Minneapolis, Minn. The abrasive-free polishing composition may be a high selectivity polishing composition to terminate the polishing process without removal of the second dielectric material.

In another embodiment, a three-step polishing process is used to polish the substrate surface. The first step removes the topography on the substrate surface by polishing the substrate with a first composition and a first fixed-abrasive polishing article. The first fixed-abrasive polishing article may include a hard resin fixed-abrasive web, for example, SWR-159, commercially available from 3M of Minneapolis, Minn. The first polishing composition is generally an abrasive-free polishing composition and may also be a low selective or high selective polishing composition. The initial polishing composition may also include additives, such as surfactants, to enhance removal or reduction of peaks or protuberances extending above the surface of the first dielectric material in order to more effectively remove topography. Alternatively, the first polishing step may be performed by polishing the substrate with an abrasive-containing composition, such as silica or ceria slurry described herein, and an abrasive-free polishing article.

The second and third polishing steps may include polishing a substrate with an abrasive-free polishing composition and a fixed-abrasive polishing article to remove any remaining first dielectric material. The fixed-abrasive polishing article for the second and third polishing steps may be a high removal rate fixed-abrasive web material, for example, the SWR-521 fixed-abrasive polishing article, commercially available from 3M of Minneapolis, Minn. The second and third fixed-abrasive polishing articles that are used in the second and third polishing steps may be the same or different polishing articles, but are preferably adapted or designed to deliver higher first dielectric removal rates than the first fixed-abrasive polishing article used in the first processing step. Multi-step polishing processes may be needed that aggressively condition the fixed-abrasive polishing article in the first step before removing the blanket oxide.

The first, second, and third polishing compositions may be abrasive-free or abrasive-containing polishing compositions. The first, second, and third polishing compositions may be a low selective or high selective polishing composition for improved process stability and for the ability to end polishing on the second dielectric material.

The process steps described herein may be performed on one or more platens, for example each separate polishing step is performed on separate platens or multiple steps may be performed on the same platen.

Alternative Polishing Techniques

The polishing process described herein may be enhanced by additional processing techniques. Polishing steps using fixed-abrasive polishing articles may include a polishing composition containing abrasive particles. The presence of abrasive particles in the polishing composition is believed to increase the removal rate of the bulk first dielectric material. The abrasives may be silica or ceria, which may be added in conjunction with the first polishing composition, or may be another polishing composition used instead of the first polishing composition. The abrasive-containing composition may also be a high selective slurry.

In addition, the polishing processes using fixed-abrasive polishing articles may be modified by a non-mechanical technique to enhance erosion of the binder material containing the abrasive particles of the fixed-abrasive polishing articles. Examples of such techniques include applying energy, for example heating, to the polishing article, applying etching or reactive chemicals to the polishing articles, or combinations thereof, to increase abrasive discharge from the binder material. Techniques may be applied to increase abrasives by modifying the polishing conditions, such as contact pressure between the substrate and polishing article or relative rotational rates between the substrate and polishing article, or polishing compositions to increase abrasive discharge from the binder material.

In another aspect, polishing the first dielectric layer with a fixed-abrasive article to remove the topography as described herein may further include conditioning the polishing article using an article conditioning mechanism to improve polishing removal rate. A hard resin fixed-abrasive web, for example, SWR-159, commercially available from 3M of Minneapolis, Minn., which may be used to remove the topography is more resistant to binder erosion that other fixed-abrasive articles. Mechanical activity, such as conditioning, or other non-mechanical activity as described herein, may be applied to enhance erosion of the binder material, which allows an increase in abrasives for polishing and an increase in polishing removal rate of substrate material, such as the first dielectric material.

The polishing article for the topography step removal may be conditioned either periodically or as necessary to increase or maintain polishing removal rates. Conditioning of the polishing article may be performed prior to or during all or part of the time of a polishing process. A high removal rate at this step is believed to remove topography, which topography can affect polishing ability of subsequent steps, and begin removing a portion of the remaining bulk first dielectric material. For example, if an acceptable removal rate is achieved over a series of substrate polishing, then no conditioning may be applied, however, if the removal rate decreases, then conditioning is performed again to increase the removal rate to the acceptable rate. Conditioning may be accomplished by a physical device like a conditioning disk or may be achieved by polishing a substrate that has topography that is more aggressive than the actual substrates being processed. In addition, the polishing article may be conditioned by adjusting processing parameters to provide the desired erosion rate of the binder material for the desired removal rate, for example, increased contact pressure between the substrate and polishing article or decreased rotational rates of the substrate and polishing article than normally used.

Additionally, defect formation from polishing residual material with a fixed-abrasive polishing article may be minimized by mechanical actions, such as a soft-landing approach or a high speed, low pressure dechuck of the substrate from the polishing article.

Alternatively, the three polishing step processes described herein may be modified to provide a third polishing step using an abrasive-containing polishing composition, such as silica or ceria slurry, on a hard polishing article. A hard polishing material is broadly described herein as a polishing material having a polishing surface of a hardness of about 50 or greater on the Shore D Hardness scale for polymeric materials as described and measured by the American Society for Testing and Materials (ASTM), headquartered in Philadelphia, Pa. The hard polishing article may include a polymeric material, i.e., plastic, or foam, such as polyurethane or polyurethane mixed with a filler material, and are usually free of abrasive particles. Examples of hard polishing articles includes the IC-1000 and IC-1010 polishing article from Rodel Inc., of Phoenix, Ariz.

Additionally, a polishing process using an abrasive-containing polishing composition, such as silica or ceria slurry, on a non-abrasive polishing article may be performed after processing steps using a fixed-abrasive polishing step. This additional polishing step may be performed after each fixed-abrasive polishing step or after the final fixed-abrasive polishing step of a process.

The fixed-abrasive polishing article polishing enhancement process techniques described herein may be used to enhance other know polishing processes using fixed-abrasive polishing articles. Additional suitable processes that may be enhanced by the processes described herein include the commonly owned polishing processes disclosed in U.S. Pat. No. 5,897,426, entitled, "Chemical Mechanical Polishing With Multiple Polishing articles" and U.S. Pat. No. 6,435,945, entitled, "Chemical Mechanical Polishing With Multiple Polishing articles," the entirety of which are incorporated herein by reference to the extent not inconsistent with the invention.

The processes described herein are believed to effectively remove the first dielectric materials, such as oxide, with less variation and defect formation on substrates have different pattern densities and different feature sizes as well as reduce overall polishing time for a process and reduce polishing time of individual polishing steps that are performed as reduced removal rates compared to conventional polishing.

Selective Polishing Compositions

The polishing steps described herein may use non-selective, low selectivity compositions or slurries (LSS), and high selectivity compositions or slurries (HSS) to remove dielectric material, such as silicon oxide, from the substrate surface. The low selectivity compositions and the high selectivity compositions may be Prestonian or non-Prestonian compositions. Prestonian compositions are broadly defined as slurries that have a removal rate proportional to both the contact pressure between the substrate and platen and the rotational speed of the platen. Non-Prestonian compositions have removal rates that are not proportional to the polishing pressure and the rotational speed. For example, a non-Prestonian composition may have a linear correlation between removal rate and polishing pressure, but may reach a range of polishing pressures, typically at decreasing polishing pressures, which results in no noticeable removal of material from the substrate surface.

While the following low selectivity compositions and the high selectivity compositions are described as abrasive-containing compositions, the invention contemplates the use of abrasive-free low selectivity compositions and the high selectivity compositions. An example of an abrasive free composition is described in co-pending U.S. patent application Ser. No. 10/074,345, filed on Feb. 2, 2002, which is incorporated by reference herein to the extent not inconsistent with the claimed aspects and disclosure herein.

Non-selective compositions generally have comparable removal rates for all materials, such as approximate removal rates of about 1:1 for silicon oxide and silicon nitride. Low selectivity compositions may have a selectivity of silicon oxide to silicon nitride between greater than about 1:1 and about 5:1, such as between about 3:1 and about 4:1. Generally, the low selectivity polishing compositions include an abrasive solution, a basic compound, such as ammonia or potassium hydroxide, and deionized water.

The low selectivity polishing compositions may include between about 10 weight percent (wt. %) and about 30 wt.

% of an abrasive solution. The abrasive solutions may contain between about 10 weight percent (wt. %) and about 30 wt. % of silica abrasive particles or between about 0.5 weight percent (wt. %) and about 5 wt. % of ceria abrasive particles. An example of an abrasive particle is ceria with a particle size of about 300 nm or less in size.

Examples of the low selectivity polishing compositions include SS-12 (about 12 wt. % abrasive silica particles) and SS-25 (about 25 wt. % abrasive silica particles), commercially available from Cabot Corp. of Aurora, Ill. and Klebosol, from Rodel Inc., of Phoenix, Ariz.

The low selectivity composition may also be diluted prior to use in polishing processes. For example, an abrasive solution containing 5 wt. % ceria may be diluted to provide about 0.2 wt. % of abrasive particles in the polishing composition. Another example of an abrasive solution is HS-8005, a ceria containing slurry, commercially available from Hitachi Chemical Co. Ltd., of Japan.

High selectivity polishing compositions generally have a selectivity of silicon oxide to silicon nitride of greater than about 5:1, and preferably have a selectivity of about 30:1 or greater, such as between about 30:1 and about 50:1. The high selectivity compositions may include compositions having abrasive solutions, additives, and solvent. The abrasive solutions, additives, and solvent may be a ratio of X:Y:Z, with X=1 to 20, Y=0 to 20, and Z=0 to 20. Examples of high selectivity compositions having the ratio include 1:2.2:0, 1:11:8, 1:6:3, and 1:12:7. The abrasive materials may be present in the high selectivity composition as described for the low selectivity compounds described herein.

High selective polishing compositions may be formed by having additives combined or mixed with abrasive solutions to form the. The additives typically comprise compounds that suppress polishing of the substrate surface to control the removal rate of oxide materials. Examples of additives include surfactants, such as polycarboxylate compounds. For example, polycarboxylate-based additives may be used to inhibit polishing and lower removal rates. An example of a suitable additive in a solution for use with the abrasive includes 8103GPE or 8102GP, commercially available from Hitachi Chemical Co. Ltd., of Japan. It is believed that additives as described herein suppress the removal rate of dielectric materials, such as silicon oxide and silicon nitride, and can be selected to selectively suppress removal of a particular material, such as silicon nitride, to provide the desired selectivity.

The ratio of abrasive solutions to additives is generally between about 1:1 and about 1:3, which is approximate to an abrasive solution concentration between about 30 volume percent (vol %) and about 50 vol % of the high selectivity polishing composition. The abrasive solution concentration may be considered equivalent to between about 30 weight percent (wt. %) and about 50 wt. %. A ratio of abrasive solution to additives of about 1:2.2 has been observed to be effective in selectively removing bulk and residual dielectric material from the surface of a substrate.

The solvent may be any suitable solvent for a polishing composition, of which water, such as deionized water, is used. The solvent and/or additive compounds may be used to dilute the high selectivity polishing compositions to have an abrasive solution concentration of about 50% or less of the initial step polishing composition. Dilution of the abrasive solution concentration allows for further reducing the formation of topographical defects, such as microscratches, during polishing.

Substrates that may be polished by the process described herein may include shallow trench isolation structures formed in a series of dielectric layers, such as silicon oxide disposed over a silicon nitride barrier layer as shown in FIG. 1. The invention contemplates polishing dielectric materials conventionally employed in the manufacture of semiconductor devices, for example, silicon dioxide, silicon nitride, and silicon oxynitride. The invention also contemplates the polishing of other dielectric materials, such as polysilicon, carbon doped silicon carbide, phosphorus-doped silicon glass (PSG), boron-phosphorus-doped silicon glass (BPSG), and silicon dioxide derived from tetraethyl orthosilicate (TEOS), high density plasma chemical vapor deposition (HDP-CVD) silicon oxides (HDP oxides), silane by plasma enhanced chemical vapor deposition (PECVD) can be employed, and combinations thereof.

One example of a substrate having at least a first dielectric material deposited on a second dielectric material includes the first dielectric material of silicon oxide deposited to a thickness between about 1000 Å and about 10,000 Å, such as between about 1000 Å and about 6000 Å on a second dielectric material, such as silicon nitride deposited to a thickness between about 200 Å and about 2000 Å, such as about 1000 Å on the substrate surface. The second dielectric material may be deposited on an oxide layer, with the oxide layer having a thickness between about 50 Å and about 200 Å, such as about 100 Å. The bulk first dielectric material is generally removed to a thickness of about 500 Å over the underlying silicon nitride layer, and then a first dielectric material residual removal process step is used to remove the remaining first dielectric material.

Polishing of the substrate surface may be performed by the polishing conditions as follows. A contact pressure between the substrate and the polishing article of about 10 psi or less, such as between about 2 psi and about 8 psi, for example between about 3 psi and about 5 psi, at a substrate rotational rate and polishing article rotational rate between about 20 rpms and about 200 rpms, such as between about 50 rpms and about 120 rpms, for example 73 rpms for the substrate rotational speed and about 77 rpms for polishing article rotational speed, for between about 30 and about 240 seconds may be used during polishing. The polishing compositions are delivered to the polishing article at a flow rate of about 150 ml/min or greater. However, processing parameters such as rotational speed, duration, and polishing pressure, will vary based upon the material used and operator requirements. Additionally, the above described polishing process is illustrative for use with the Mirra® Polishing system, and other processing conditions for other polishing apparatus, for example the Reflection™ Polishing System may be used to perform the processing described herein.

Additionally, each polishing step may be followed with a polishing article and substrate rinse using deionized water. The polishing step may also include a finishing step of deionized water polish at 2 psi for 15 seconds, a second polishing composition polish at 2 psi for 5 seconds, or a second polishing composition polish at 2 psi for 5 seconds followed by a deionized water polish at 2 psi for 10 seconds. Further, the substrate may be cleaned by polishing the substrate with a soft polishing article, such as a Politex article, using deionized water, following polishing of the substrate by a high selectivity polishing process.

While the foregoing is directed to embodiments of the present invention, other and further embodiments of the invention may be devised without, departing from the basic scope thereof, and the scope thereof is determined by the claims that follow.

What is claimed is:

1. A method for processing a substrate, comprising:
   providing a substrate comprising a bulk dielectric material disposed on a patterned dielectric material in an amount sufficient to fill feature definitions of the patterned dielectric material;
   polishing the substrate with a first polishing composition and an abrasive-free polishing article until bulk dielectric material is substantially removed; and
   polishing the substrate with a second polishing composition and a fixed-abrasive polishing article to remove residual bulk dielectric material and expose the patterned dielectric material between the feature definitions.

2. The method of claim 1, wherein the first polishing composition comprises an abrasive-containing polishing composition.

3. The method of claim 2, wherein the first polishing composition has a removal rate ratio of bulk dielectric material to patterned dielectric material of between about 1:1 and about 5:1.

4. The method of claim 1, wherein the second polishing composition has a removal rate ratio of bulk dielectric material to patterned dielectric material of about 30:1 or greater.

5. The method of claim 1, wherein the fixed-abrasive polishing article comprises a high removal rate fixed-abrasive web material.

6. The method of claim 1, wherein the second polishing composition further contains abrasive particles.

7. The method of claim 1, further comprising altering the surface of the fixed-abrasive polishing article with a non-mechanical technique selected from the group of applying heat to the polishing article, chemical etching the polishing article, and combinations thereof.

8. A method for processing a substrate, comprising:
   providing a substrate comprising a material layer, an oxide layer disposed over the material layer, a patterned dielectric material disposed on the oxide layer with feature definitions extending through the three layers, and a bulk dielectric material disposed on the patterned dielectric material in a sufficient amount to fill the feature definitions;
   polishing the substrate with a first polishing composition and an abrasive-free polishing article until the bulk dielectric material is substantially removed; and
   polishing the substrate with a second polishing composition and a fixed-abrasive polishing article to remove residual bulk dielectric material to expose the patterned dielectric material between the feature definitions.

9. The method of claim 8, wherein the first polishing composition comprises an abrasive-containing polishing composition.

10. The method of claim 9, wherein the first polishing composition has a removal rate ratio of bulk dielectric material to patterned dielectric material of between about 1:1 and about 5:1.

11. The method of claim 8, wherein the second polishing composition has a removal rate ratio of bulk dielectric material to patterned dielectric material of about 30:1 or greater.

12. The method of claim 8, wherein the fixed-abrasive polishing article comprises a high removal rate fixed-abrasive web material.

13. The method of claim 8, wherein the second polishing composition further contains abrasive particles.

14. A method for processing a substrate, comprising:
   providing a substrate comprising a material layer, an oxide layer disposed over the material layer, a patterned dielectric material disposed on the oxide layer with feature definitions extending through the three layers, and a bulk dielectric material disposed on the patterned dielectric material in a sufficient amount to fill the feature definitions;
   polishing the substrate with a first polishing composition and an abrasive-free polishing article until the bulk dielectric material is substantially removed; and
   polishing the substrate with a second polishing composition and a fixed-abrasive polishing article to remove residual bulk dielectric material to expose the patterned dielectric material between the feature definitions, wherein the bulk dielectric material comprises silicon oxide and the patterned dielectric material comprises silicon nitride.

* * * * *

UNITED STATES PATENT AND TRADEMARK OFFICE
CERTIFICATE OF CORRECTION

PATENT NO. : 7,063,597 B2  Page 1 of 1
APPLICATION NO. : 10/693683
DATED : June 20, 2006
INVENTOR(S) : Gopalakrishna B. Prabhu et al.

It is certified that error appears in the above-identified patent and that said Letters Patent is hereby corrected as shown below:

Column 4, Line 13: Before "abrasive-free", change "a" to --an--

Column 5, Lines 3 and 16: Before "abrasive-free", change "a" to --an--

Column 7, Line 31: Before "abrasive-free", change "a" to --an--

Column 11, Line 9: Change "that" to --than--

Column 12, Line 6: Change "know" to --known--

Column 13, Line 36: Delete "to form the"

Column 14, Lines 46, 47, and 48: Change each instance of "rpms" to --rpm--

Column 15, Line 9: Delete the comma after "without"

Signed and Sealed this

Fourteenth Day of November, 2006

JON W. DUDAS
*Director of the United States Patent and Trademark Office*